United States Patent [19]
Schreck et al.

[11] Patent Number: 5,313,427
[45] Date of Patent: May 17, 1994

[54] EEPROM ARRAY WITH NARROW MARGIN OF VOLTAGE THRESHOLDS AFTER ERASE

[75] Inventors: John F. Schreck, Houston; David J. McElroy, Allen; Pradeep L. Shah, Dallas, all of Tex.

[73] Assignee: Texas Instruments Incorporated, Dallas, Tex.

[21] Appl. No.: 763,105

[22] Filed: Sep. 20, 1991

[51] Int. Cl.$^5$ .................. G11C 16/06; G11C 11/34
[52] U.S. Cl. .......................... 365/218; 365/185; 365/230.04
[58] Field of Search ............ 365/218, 900, 185, 230.04

[56] References Cited

U.S. PATENT DOCUMENTS

| | | | |
|---|---|---|---|
| 4,878,101 | 10/1989 | Hsieh et al. | 365/185 |
| 4,912,676 | 3/1990 | Paterson et al. | 365/900 |
| 4,996,571 | 2/1991 | Rome et al. | 365/218 |
| 5,021,847 | 6/1991 | Eitan et al. | 365/185 |
| 5,077,691 | 12/1991 | Haddad et al. | 365/218 |
| 5,095,344 | 3/1992 | Harari | 365/900 |
| 5,132,935 | 7/1992 | Ashmore, Jr. | 365/185 |
| 5,168,335 | 12/1992 | D'Arrigo et al. | 365/900 |
| 5,185,718 | 2/1993 | Rinerson et al. | 365/218 |
| 5,191,556 | 3/1993 | Radjy | 365/900 |

Primary Examiner—Eugene R. LaRoche
Assistant Examiner—Michael C. Kessell
Attorney, Agent, or Firm—Theodore D. Lindgren; Leo N. Heiting; Richard L. Donaldson

[57] ABSTRACT

A nonvolatile memory has pairs of cells in which each cell includes a control gate, a floating gate and a source/drain diffusion. A first cell in each of the pairs is producible to have one value of floating-gate to diffusion capacitance. A second cell in each of the pairs is producible to have a second value of floating-gate to diffusion capacitance different from the first value. The memory includes a first circuit for applying a first erasing pulse to the control gates and the diffusions of the first cells of the pairs and includes a second circuit for applying a second erasing pulse to the control gates and the diffusions of the second cells of the pairs. The first erasing pulse is adjustable to have a different magnitude than the second erasing pulse in order to narrow the margin of erased threshold voltages and thereby compensate for misalignment.

34 Claims, 5 Drawing Sheets

EEPROM ARRAY WITH NARROW MARGIN OF VOLTAGE THRESHOLDS AFTER ERASE

NOTICE (C) Copyright Texas Instruments Incorporated 1991. A portion of the disclosure of this patent document contains material that is subject to copyright protection. Texas Instruments Incorporated has no objection to the facsimile reproduction of the issued patent or of the patent disclosure as that disclosure appears in the Patent and Trademark Office patent file or records. All other copyright rights whatsoever are reserved.

CROSS-REFERENCE TO RELATED APPLICATION

The following co-assigned patent application is hereby incorporated herein by reference: U.S. Pat. application Ser. No. 07/723,010 filed Jun. 28, 1991.

BACKGROUND OF THE INVENTION

The present invention relates to a nonvolatile, integrated-circuit memory array such as an electrically-erasable, electrically-programmable read-only-memory (EEPROM) array, and more particularly to an EEPROM array in which the memory cells are erased by Fowler-Nordheim tunnelling.

EEPROMs employing single transistor memory cells, using hot-carrier injection for programming and Fowler-Nordheim tunnelling for erasure have been described in: (a) "A Single Transistor EEPROM cell and its implementation in a 512K CMOS EEPROM", S. Mukherjee et al., IEDM 1985 (p. 616-619); and (b) "A 90ns 100K Erase/Program Cycle Megabit Flash Memory", V. Kynett et al., ISSCC 1989 (p. 140-141). Reference (a) is also discussed in U.S. Pat. No. 4,698,787.

During cell erasing, appropriate erasing voltages applied to the control-gates/wordlines and the source lines allow removal of a selected charge from the floating gate. Normally, all control gates are grounded during erase operation of a flash EEPROM or, in the alternative, all control gates have the same negative voltage applied.

The erase voltage threshold Vt window of a flash EEPROM is affected by the amount of source/drain diffusion that underlaps the floating gate on, for example, the source side. Field-oxide rounding results in different amounts of underlap depending on how much of the gate resides over the rounded edge of the field oxide. Because of misalignment, the amount of underlap differs between alternate rows of cells, where the cells are constructed in the manner described above-listed references. If the identical erasing pulses are used to erase all of the rows of cells, a bimodal, with possibly wide-margin, distribution of voltage thresholds Vt results. The bimodal distribution adversely affects the reading and programming operations of the nonvolatile memory.

Accordingly, a need exists for a circuit to correct, or narrow the margin of, the bimodal distribution of voltage threshold characteristics caused by different underlap in misaligned alternating rows of cells.

SUMMARY OF THE INVENTION

The circuit of this invention corrects the adverse effect of the field oxide rounding and alternating-row underlap variation. The circuit decreases the size of erase voltage threshold Vt window (the range of values of Vt) for a flash EEPROM where that window is enlarged, or widened, by a misalignment. The method used is to apply different wordline erase voltages to alternating rows (e.g., odd-numbered rows or even-numbered rows) during the erasing operation to compensate for the different source diffusion to floating-gate electric fields that result from the misalignment.

The nonvolatile memory of this invention has pairs of cells in which each cell includes a control gate, a floating gate and a source/drain diffusion. A first cell in each of the pairs is producible to have one value of floating-gate to diffusion capacitance. A second cell in each of the pairs is producible to have a second value of floating-gate to diffusion capacitance different from the first value. The memory includes a first circuit means for applying a first erasing pulse to the control gates and the diffusions of the first cells of the pairs and includes a second circuit means for applying a second erasing pulse to the control gates and the diffusions of the second cells of the pairs. The first erasing pulse is adjustable to have a different magnitude than the second erasing pulse in order to narrow the margin of erased threshold voltages.

DETAILED DESCRIPTION OF THE INVENTION

Figure 1:
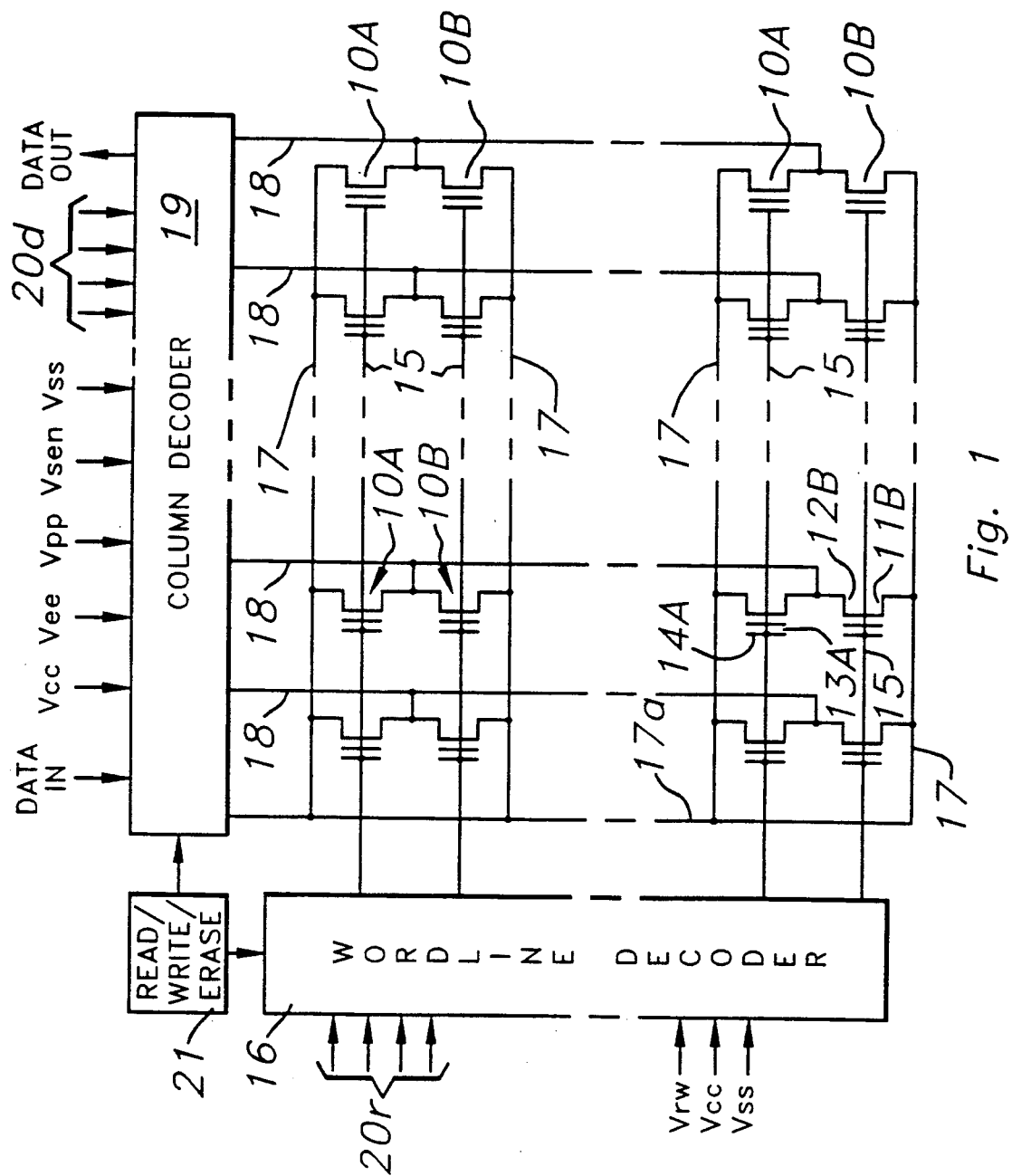
FIG. 1 is an electrical schematic diagram, in partial block form, of a memory cell array.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13, a control gate 14 and a gate oxide 28. Each of the control gates 14 in a row of cells 10 is connected to a wordline 15, and each of the wordlines 15 is connected to a wordline decoder 16. Each of the source electrodes 11 in a row of cells 10 is connected to a source line 17. Each of the drain electrodes 12 in a column of cells 10 is connected to a drain-column line 18. Each of the source lines 17 is connected by a line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programming voltage Vrw (approx. +12V) on a selected wordline 15, including a selected control-gate conductor 14. Column decoder 19 also functions to place a second programming voltage Vpp (approx. +5 to +10V) on a selected drain-column line 18 and, therefore, the drain region 12 of selected cell 10. Source lines 17 are connected to reference potential Vss. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately $-2V$ to $-6V$ with respect to the channel region. For memory cells 10 fabricated in accordance with the preferred embodiment, the coupling coefficient between a control gate 14/wordline 15 and a floating gate 13 is approximately 0.6. Therefore, a programming voltage Vrw of 12 volts, for example, on a selected wordline 15, including the selected control gate 14, places a voltage of approximately +7.2V on the selected floating gate 13. The voltage difference between the floating gate 13 (at approx. +7.2V) and the grounded (approx. 0v) source line 17 is insufficient to cause a Fowler-Nordheim tunnelling current across the gate oxide 28 between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the wordlines 15 to reference potential Vss. The column decoder 19 also functions to apply a high positive voltage Vee (approx. +10V to +15V) to all the source lines 17. These erasing voltages create sufficient field strength across the gate oxide region 28 to generate a Fowler-Nordheim tunnel current that transfers charge from the floating gate 13, erasing the memory cell 10. Since the potential on the wordline 15 is 0V, the cell 10 remains in the nonconducting state during erase, and therefore, no channel-hot carriers are generated. The field-plate breakdown voltage of the source line junction has been made high enough to inhibit hot-carrier injection. In addition, the source junction should be optimized to minimize band-to-band tunnelling during erase operation.

In the read mode, the wordline decoder 16 functions, in response to wordline address signals on lines 20r and to signals from Read/Write/Erase control circuit 21, to apply a preselected positive voltage Vcc (approx. +5V) to the selected wordline 15, and to apply a low voltage (ground or Vss) to deselected wordlines 15. The column decoder 19 functions to apply a preselected positive voltage Vsen (approx. +1V) to at least the selected drain-column line 18 and to apply a low voltage (0V) to the source line 17. The column decoder 19 also functions, in response to signal on address lines 20d, to connect the selected drain-column line 18 of the selected cell 10 to the DATA OUT terminal. The conductive or nonconductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10 but are insufficient to create either hot-carrier injection or Fowler-Nordheim tunnelling that would disturb the charge condition of any floating gate 13.

For convenience, a table of read, write and erase voltages is given in TABLE I below:

TABLE I

|  | Read | Write | Flash Erase |
| --- | --- | --- | --- |
| Selected Wordline | 5 V | 12 V | 0 V (All) |
| Deselected Wordlines | 0 V | 0 V | — |
| Selected Drain Line | 1.0 V | 5–10 V | Float (All) |
| Deselected Drain Lines | Float | Float | — |
| Source Lines | 0 V | About 0 V | 10–15 V (All) |

Figure 2:
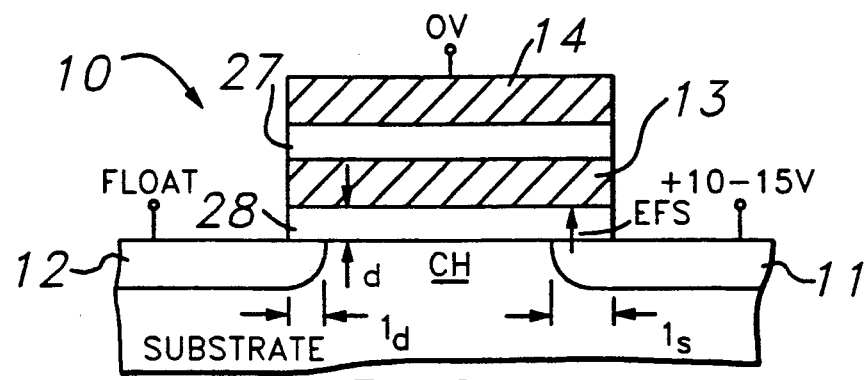
FIG. 2 is an elevation view in section of a floating gate memory cell are plan views of a prior-art cell array of the type discussed herein, FIG. 1a illustrating proper alignment of a stack-etch and FIG. 1b illustrating the effect of misalignment.
Figure 3:
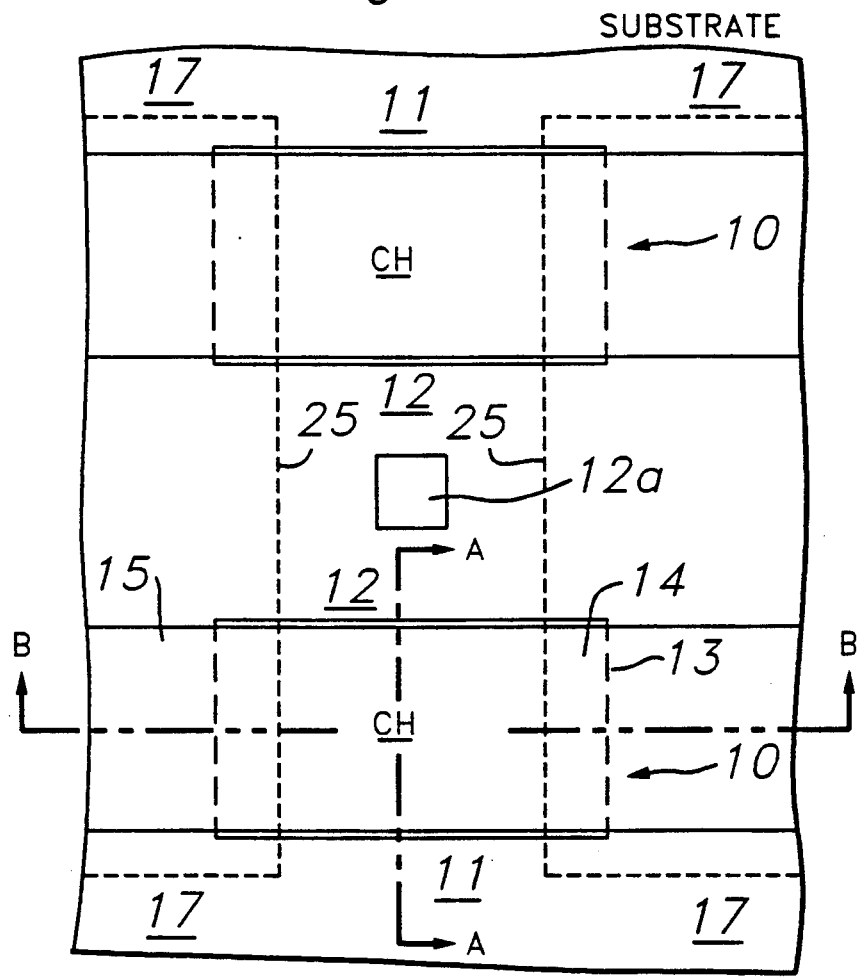
FIG. 3 is a designer's plan view of a floating gate memory cell of the type discussed herein.
Figure 4:
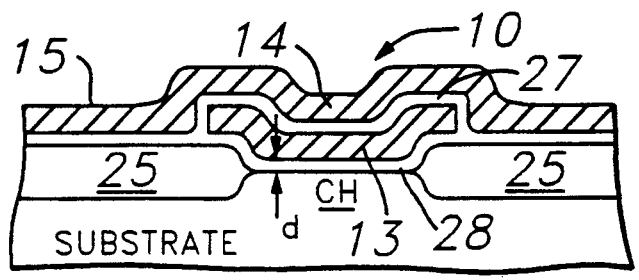
FIG. 4 is an elevation view taken along lines B—B of FIG. 3.

Referring to FIGS. 2, 3 and 4, in prior-art memory cells, such as those discussed in references (a) and (b), the field oxide isolation regions 25 are used to improve capacitive coupling between control gate 14 (poly 2) and floating gate 13 (poly 1), by increasing the capacitance area between control gate and floating gate in addition to providing isolation between adjacent cells. The source line 17 (diffused N+) runs substantially parallel to the wordlines 15 and separates the field oxide regions 25 between pairs of wordlines 15. Drain regions 12 are shared between each pair of wordlines 15. The drains 12 in a column are connected by a metal column line 17a (not shown in FIG. 2). Each drain contact DC with the metal line 18 is isolated from the adjacent contact by the field oxide regions 25.

Figure 5:
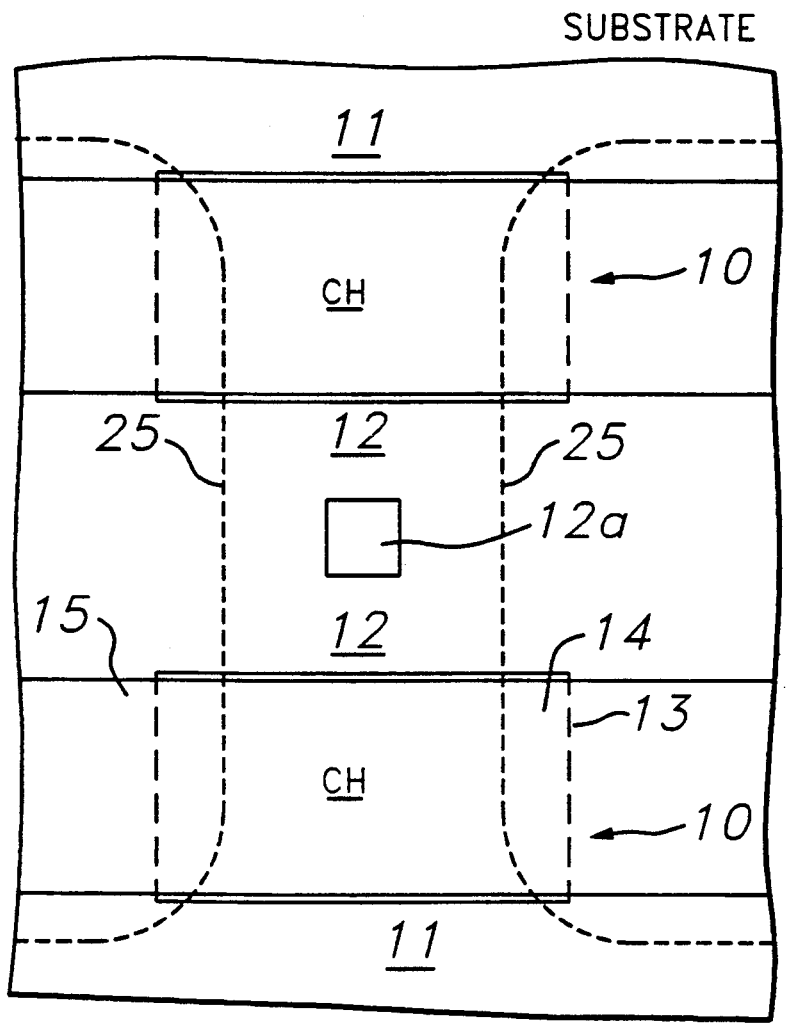
FIG. 5 illustrates the cell design of FIG. 3 after manufacture, including the rounding of the field oxide edges due to field oxide encroachment.
Figure 7:
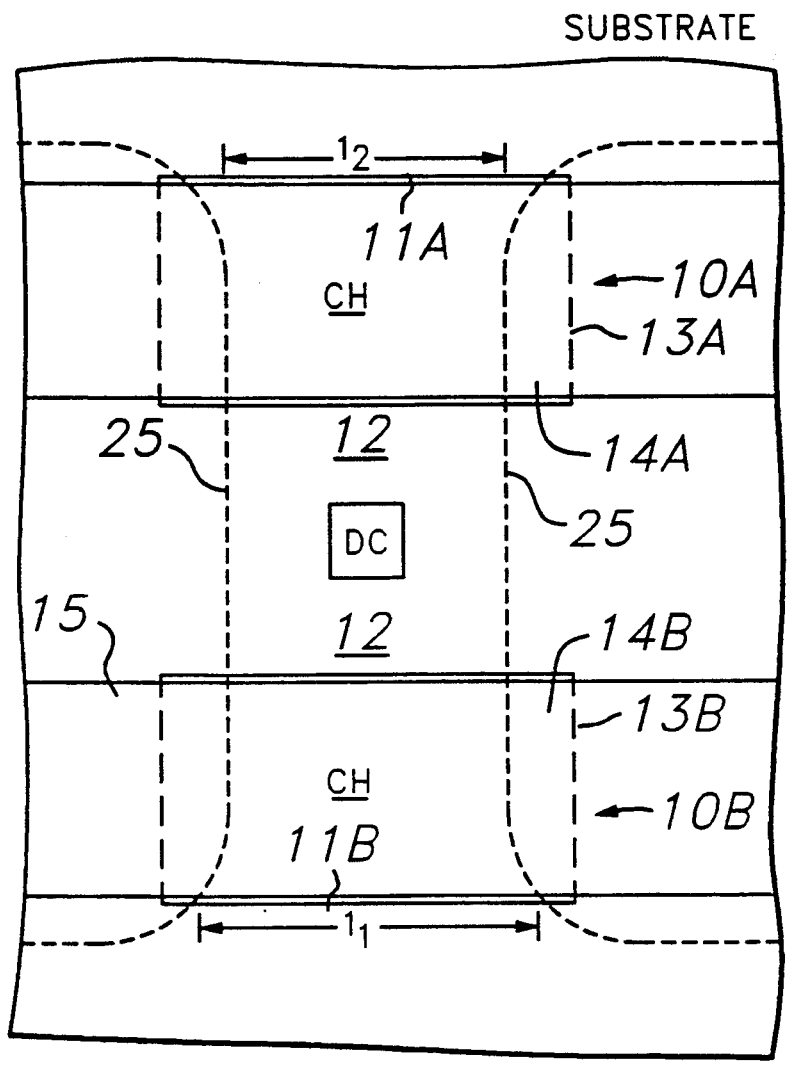
FIG. 7 illustrates how a misalignment between the control gate and field oxide results in bimodal erase voltage thresholds for a memory array.

Thus, the field oxide regions 25 provide both improved control-gate/floating-gate capacitive coupling as well as isolation between adjacent cells. The presence of field oxide regions 25 separated by a continuous source line 17 avoids the need for a metal line contacting sources 11, saving valuable silicon real estate. These field oxide regions 25 are designed and formed using masks having straight lines, as illustrated in FIG. 3. However, after the photolithographic process and the LOCOS process, the field oxide regions 25 are rounded as shown in FIGS. 5 and 7, which are discussed below. The reason for the shape is related to lithographic rounding at the corners and to the field oxide growth rate differences between narrow regions and wide regions. Alternatively, the shape of field oxide region 25 may have the "dog bone" shape as described in other publications.

Multiple conductive wordlines 15, each defining a row of memory cells, are formed on the face of the substrate 22. The N+ source lines 17 include source regions 11 of memory cells. The source lines 17 are contacted by a metal conductor (not shown) every 8, 16 or 32 cells to save chip area required by contacts.

A wordline 15 includes control-gate conductors 14 for the memory cells in the wordline 15 row. Floating-gate conductors 13 extend across a memory cell 10 (aligned with a respective wordline 15/control gate 14), over the channel Ch between source 11 and drain 12. The wordlines 15 are actually aligned with the floating-gate conductors 13. The slight offset depicted in FIGS. 3, 5 and 7 is for the purpose of clarity.

For each memory cell, wordline 15 includes a control gate conductor 14. An underlying floating-gate conductor 13 is insulated from the control gate conductor 14 by an inter-level dielectric insulator (e.g., Oxide-Nitride-Oxide) layer 27, and from the channel region Ch by the gate insulator (e.g., oxide) layer 28.

The floating-gate 13 is capacitively coupled to the channel region Ch through relatively thin gate insulator 28 (about 80–150 Angstroms of oxide). The capacitive coupling between the control gate 14 and the floating gate 13 is enhanced by extension of the control gate 14 and the floating gate 13 over parts of adjacent cell-isolation thick-field insulators 25.

Various implant procedures can be used to tailor the junctions of the source/drain diffusions 11,12 for optimum erasing and programming efficiency, respectively. For programming efficiency, the drain-channel junction is tailored to exhibit an abrupt profile that facilitates hot-carrier injection. For erasing operations free of gated-diode breakdown, the source-channel junction is tailored to exhibit a sloped (graded) profile.

The memory cell pair configuration of the illustrated embodiment is not critical to the present invention, but is a matter of routine design choice. Alternative memory cell configurations may be adapted to use various aspects of this invention, including Fowler-Nordheim tunnelling for erasing and channel and junction profiling to enhance avalanche-injection efficiency.

Flash EEPROMs are erased by removing electrons from the floating gates 13 of the memory cells 10 via Fowler-Nordheim tunnelling. This is achieved by increasing the voltage at the source 11 of each cell 10 to a high voltage (10–15 volts) and holding the control gate 14 of that cell at ground while allowing the drain 12 to float. Another method is to couple the control gate 14 to a negative potential and increase the source 11 voltage to a value of around 5 volts. Both of these methods create a large electric field between the source 11 diffusion and the floating gate 13 such that the floating gate 13 is at a lower potential than the potential of the source 11. This is shown in FIG. 2, where "E" is the electric field.

The electric field $E_{FS}$ is affected by many parameters. Three of the parameters are d=dielectric thickness, $l_d$=drain diffusion underlap distance, and $l_s$=source diffusion underlap distance.

The field $E_{FS}$ is also affected by the ratio of floating gate 13 area covered by the control gate 14 to the floating gate 13 area over the channel Ch, the latter area not including floating gate 13 area over the field oxide 25.

The distance "d" in FIG. 4 is the same dielectric thickness as in FIG. 1. The drawing of FIG. 3 represents a designer's drawing and a mask for a pair of cells 10 on, for example, a computer-aided-design system. In reality, pair of cells 10 looks much different after the manufacturing process is complete. FIG. 5 illustrates the pair of cells 10 masked as in FIG. 3 after manufacture. The field oxide 25 edges are rounded due to field oxide encroachment and lithography.

In the properly aligned example of FIG. 5, the channel Ch on the source 11 side is illustrated as being larger than on the drain 12 side. In addition, the channel area Ch is illustrated as being larger than that intended by the design of FIG. 3. If the rounding of the field oxide 25 does not extend into the channel Ch, the source 11 and drain 12 sizes will not differ and the channel Ch will not be larger than intended.

Figure 6:
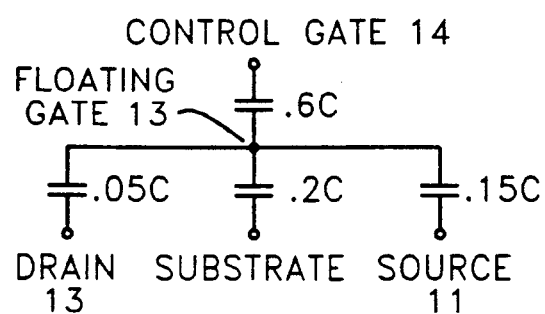
FIG. 6 illustrates various components that affect the field $E_{FS}$ between the source diffusion and the floating gate.

Referring to FIG. 6, the various component capacitances that affect the electric field $E_{FS}$ between the source 11 and the floating gate 13 are illustrated. All of the capacitance values are normalized.

As discussed previously, certain types of flash EEPROMs are characterized by the fact that the sources 11 and drains 12 are doped differently, resulting in the source 11 diffusion extending much farther under the floating gate 13 than the drain 12 diffusion does. For that reason, the example capacitor values for the source 11 and drain 12 diffusions of the circuit of FIG. 6 are different. If it is assumed, for example, that all of the capacitors are initialized to 0 volts along with all of the nodes and that the source 11 is ramped to 12 volts, then the floating gate 13 voltage ramps to $[0.15/(0.05+0.15+0.2+0.6)] \times 12V = 1.8V$. This is true if all other nodes (except the source 11) are maintained at Vss, or 0 volts. If the gate dielectric 28 is 100 Angstroms thick, then the field $E_{FS}$ between source 11 and floating gate 13 is $(12-1.8)/100A = 10.2$ megavolts per cm.

But if, for example, the source 11 capacitance is changed from 0.15C to 0.3C, then the electric field $E_{FS}$ is $(12-3.6)/100A = 8.4$ megavolts per cm. This field difference causes a different floating gate 13 potential after erase operation, if the same erase pulse width or duration is used. During Fowler-Nordheim tunnelling, electrons are removed from the floating gate 13 until the potential of the floating gate 13 becomes less negative with respect to the substrate, such that the electric field $E_{FS}$ is low enough that tunnelling does not occur.

FIG. 7 illustrates how a misalignment between the control gate 13 and field oxide 25 results in bimodal erase voltage thresholds for a memory array. The erase voltage threshold Vt is defined as the upper limit, or highest control gate voltage, at which the memory chip detects that a memory cell is erased (detects a logic "one").

The control gates 14A and 14B of FIG. 7 are shifted, or misaligned toward the bottom of the page with respect to the field oxide 25 edge. Because of the rounding of the field oxide 25 edge at what were designed to be 90 degree angles, length $l_1$ is larger than length $l_2$. Length $l_1$ represents the distance along the floating gate 13B over the source 11B diffusion. Length $l_2$ represents the distance along the floating gate 13A over the source 11A diffusion. As described previously, the difference in distances $l_1$ and $l_2$ causes potentially large differences in the electric fields, $E_{FS}$, between the memory cell 10B having a length $l_1$ and a memory cell 10A having a length $l_2$. Large differences in length may occur because the source 11 diffusion underlap distance, $l_s$ of FIG. 2, is a large contribution to the total capacitance as described in FIG. 6.

One method for decreasing the alignment sensitivity is to increase the space between the control gate 14 and the field oxide 25 edge common to the source 11 diffusion and parallel to the control gate 14. An area penalty is one obvious disadvantage of this approach.

By using different potentials on the top control gate 14A and lower control gate 14B, the field $E_{FS}$ for each cell (upper vs. lower, or odd vs. even, if they are labeled sequentially) is made to match. By doing so, the erased threshold voltages of cells 10A and 10B are made to match or be closer, even when misalignment occurs to a large enough degree to cause different source 11 to floating-gate 13 capacitance terms.

Figure 8:
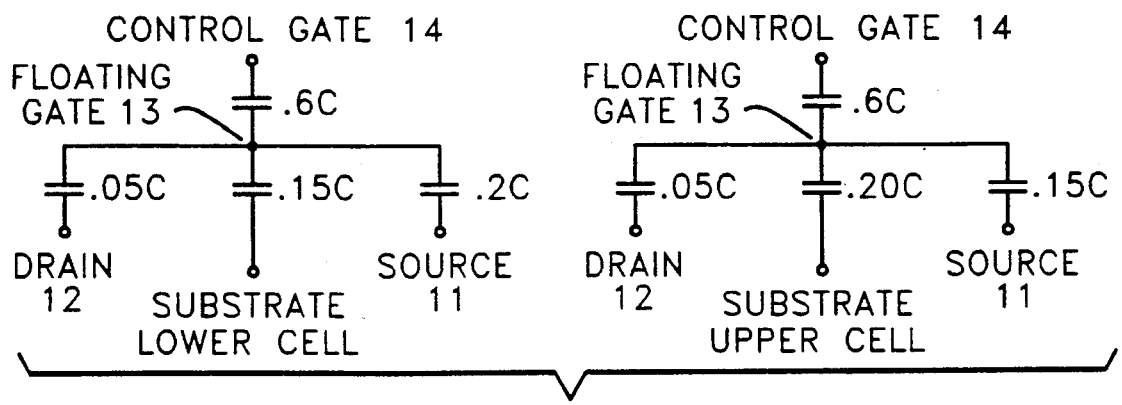
FIG. 8 illustrates the effect of the misalignment of FIG. 7 on the circuit of FIG. 6.

Referring now to FIG. 8, example normalized capacitance values are illustrated, the normalized values being typical of those that may result from the misalignment shown in FIG. 7.

Assume again that the upper cell 10A of FIGS. 7 and 8 has all nodes initialized to 0 volts. If the source 11A is ramped to 12 volts, the resulting floating gate 13A voltage, if other nodes are grounded, is 1.8 volts as explained previously. For the same voltage conditions, the floating gate 13B of the lower cell is 0.2(12)=2.4 volts. A difference of 2.4−1.8=0.6 volt exists between the floating gates 13A and 13B of the upper and lower cells 10A and 10B. To compensate, the voltage on the control gate 14A of the upper cell 10A is increased. The necessary increase is 0.6 volt/[0.6C/(0.6C+0.05C+0.15C+0.2C)]=1 volt. This required offset is consistent and unchanging throughout the full array, of which FIG. 3 is one small part.

Figure 9:
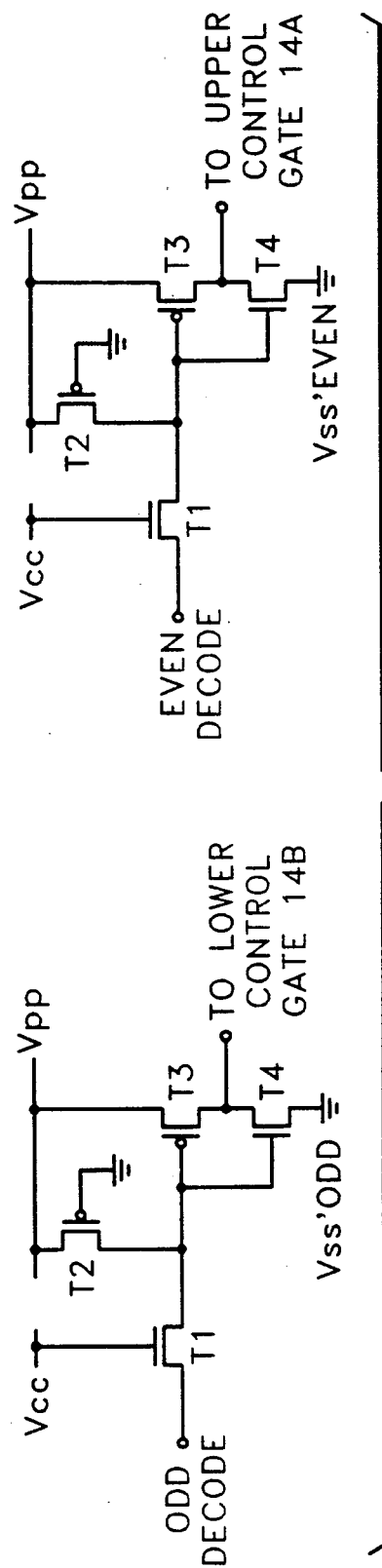
FIG. 9 illustrates an example implementation of alternate-row control gate voltages to compensate for the misalignment of FIG. 7.

An example implementation of alternate-row control gate voltages is illustrated in FIG. 9. In FIG. 9, logic signals are applied to the ODD DECODE and EVEN DECODE terminals. At least one of the bits, perhaps the least significant bit, of the wordline address signals 20R corresponds to even and odd wordlines and that bit is used to decode the signal applied to the ODD DECODE and EVEN DECODE terminals. Transistors T1 provide isolation, preventing the relatively high voltage Vpp from reaching the ODD DECODE and EVEN DECODE terminals. Transistors T2 a load transistors. Transistor T3 and T4 form inverters. The voltages and the Vss'ODD and the Vss'EVEN terminals are at voltage Vss except during erase, when the voltages are set to potentials that make cells on the same wordline 15 and driver (odd) have the same field $E_{FS}$ as the cells on the wordline 15 line and drivers (even) directly above or below.

In the example above, the circuit of FIG. 9 is included in the wordline driver circuitry of the wordline decoder 16 of FIG. 1.

During the test stage of manufacture and using the procedure described above, the required offset is determined and programmed into the device for future operation. With each alignment change between manufactured batches of memories, the offset is measured and programmed permanently into the memory.

The measurement and permanent programming described above may be avoided by using the circuit of FIG. 9 to erase in two passes, each pass comprising a series of steadily increasing erase pulses. In one pass, for example, the odd rows are erased with the control-gate voltages equal to Vss while the even rows are erased with control-gate voltages at a sufficiently high value to avoid over-erasure. The cells are checked after each erase cycle to determine whether or not complete erasure has occurred. The process is reversed in the second pass. That is, even rows are erased with the control-gate voltages at Vss and odd rows are erased with the control-gate voltages at a sufficiently high value to avoid over-erasure. Over-erasure occurs when enough electrons are removed from the floating gate 13 to make a cell 10 conduct when the cell 10 is supposed to be non-conductive in the deselected state.

This invention also applies to arrays in which a misalignment in the x-direction results in different $E_{FS}$, as can be the case in virtual-ground-type arrays. Where a misalignment affects the capacitive coupling of the drains 12 to the floating-gates 13 between alternate column of cells 10, a similar odd and even combination of bitline voltages is applied to column lines 18 rather than wordlines 15. The drains 12 are normally left floating in such arrays. However, compensation for misalignment in the x-direction is made by driving every other drain 12 to a value that makes the effective field the same for both odd and even column-lines. Circuitry similar to that of FIG. 9 is included in a column decoder, the column decoder being similar to the column decoder 19 of FIG. 1, but designed for a virtual-ground-array application.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A nonvolatile memory having at least one reference potential, and having pairs of cells, each cell having a control gate, a floating gate and a source/drain diffusion, a first cell of each of said pairs having a first value of floating-gate to diffusion capacitance, a second cell of each of said pairs having a second value of floating-gate to diffusion capacitance, said memory comprising;

a first circuit for applying a first erasing pulse to each of said control gates and said diffusions of said first cells of said pairs;

a second circuit for applying a second erasing pulse to each of said control gates and said diffusions of said second cells of said pairs, said first erasing pulse adjustable to have a different magnitude than said second erasing pulse to narrow the threshold voltage margin caused by any difference between said first value and said second value; and one of said first and second circuits including an input for varying said reference potential applied to one of said control gates and said diffusions.

2. The memory of claim 1, wherein said first and second floating-gate to diffusion capacitances are different because of a misalignment during production thereof.

3. The memory of claim 1, wherein said magnitudes of said first and second erasing pulses are adjustable to result in a narrow margin of erased threshold voltages.

4. The memory of claim 1, wherein said first and second cells of said pair are in separate rows of cells.

5. The memory of claim 1, wherein said first and second cell of said pair are in separate columns of cells.

6. The memory of claim 1, wherein said diffusion of each of said first cells underlaps said floating gate of each of said first cells.

7. The memory of claim 1, wherein each of said first and second circuits includes an input for decoding each cell of each said pair.

8. The memory of claim 1, wherein each of said first and second circuits includes an inverter circuit for applying said first and second erasing pulses.

9. The memory of claim 1, wherein each of said first and second circuits includes an input for decoding each cell of said pair and wherein each of said first and second circuits includes at least one isolation transistor for isolating said decoding input from one of said first and second erasing pulses.

10. A nonvolatile memory having at least one reference potential, and having pairs of cells, each cell having a control gate, a floating gate and a source/drain diffusion, a first cell of each of said pairs having a first value of floating-gate to diffusion capacitance, a second cell of each of said pairs having a second value of floating-gate to diffusion capacitance, said memory comprising;
 a first circuit for applying a first erasing pulse to each of said control gates and said diffusions of said first cells of said pairs;
 a second circuit for applying a second erasing pulse to each of said control gates and said diffusions of said second cells of said pairs, said first erasing pulse adjustable to have a different magnitude than said second erasing pulse to narrow the distribution of threshold voltage caused by any difference between said first value and said second value; and
 said first and second circuits including an input for decoding each cell of said pair, each of said first and second circuits including at least one isolation transistor for isolating said decoding input from one of said first and second erasing pulses.

11. The memory of claim 10, wherein said first and second floating-gate to diffusion capacitances are different because of a misalignment during production thereof.

12. The memory of claim 10, wherein said magnitudes of said first and second erasing pulses are adjustable to result in a narrow margin of erased threshold voltages.

13. The memory of claim 10, wherein said first and second cells of said pair are in separate rows of cells.

14. The memory of claim 10, wherein said first and second cell of said pair are in separate columns of cells.

15. The memory of claim 10, wherein at least one of said first and second circuits includes an input for varying said reference potential applied to one of said control gates and said diffusions.

16. The memory of claim 10, wherein said diffusion of each of said first cells underlaps said floating gate of each of said first cells.

17. The memory of claim 10, wherein each of said first and second circuits includes an input of decoding each cell of each said pair.

18. The memory of claim 10, wherein each of said first and second circuits includes an inverter circuit for applying said first and second erasing pulses.

19. A method for obtaining a narrow margin of voltage thresholds in a nonvolatile memory having pairs of cells, said memory having at least a first and a second reference voltage, each pair of cells having a first cell and a second cell, each said first and second cell having a control gate, a floating gate and a source/drain diffusion, said method comprising;
 applying a first erasing pulse to each of said control gates and said diffusions of said first cells of said pairs;
 applying a second erasing pulse to each of said control gates and said diffusions of said second cells of said pairs; and
 adjusting the relative magnitudes of said first and second erasing pulses by varying said first reference voltage applied to said control gates of said first cells to be different than said second reference voltage applied to said control gates of said second cells, said magnitudes adjusted to result in a narrower margin of threshold voltages where said first cell of each of said pairs has a first value of floating-gate to diffusion capacitance and where said second cell of each of said pairs has a second value of floating-gate to diffusion capacitance different from said first value.

20. The method of claim 19, wherein said first and second cells have different floating-gate to diffusion capacitances caused by a misalignment during production thereof.

21. The method of claim 19, wherein said first and second cells of said pair are in separate rows of cells.

22. The method of claim 19, wherein said first and second cells of said pair are in separate columns of cells.

23. The method of claim 19, wherein said diffusion of each said first cells underlaps said floating gate of each of said first cells.

24. The method of claim 19, wherein said first and second erasing pulses are generated by circuits including inputs for decoding each cell of each said pair.

25. The method of claim 19, wherein said first and second erasing pulses are generated by circuits including inverters for applying said first and second erasing pulses.

26. The method of claim 19, wherein said first and second erasing pulses are generated by circuits including inputs for decoding each cell of each said pair and wherein said circuits include isolation transistors for isolating said decoding inputs from said first and second erasing pulses.

27. A method for obtaining a narrow margin of voltage thresholds in a nonvolatile memory having pairs of cells, said memory having at least one reference voltage, each pair of cells having a first cell and a second cell, each said first and second cell having a control gate, a floating gate and a source/drain diffusion, said method comprising;
 applying a first erasing pulse to each of said control gates and said diffusions of said first cells of said pairs;
 applying a second erasing pulse to each of said control gates and said diffusions of said second cells of said pairs;
 adjusting the magnitudes of said first erasing pulse and said second erasing pulse to narrow the margin of erased threshold voltages where said first cell of each of said pairs has a first value of floating-gate to diffusion capacitance and where said second cell of each of said pairs has a second value of floating-gate to diffusion capacitance different from said first value;
 said first and second erasing pulses generated by circuits including inputs for decoding each cell of each said pair; and
 said circuits including isolation transistors for isolating said decoding inputs from said first and second erasing pulses.

28. The method of claim 27, wherein said first and second cells have different floating-gate to diffusion capacitances caused by a misalignment during production thereof.

29. The method of claim 27, wherein said first and second cells of said pair are in separate rows of cells.

30. The method of claim 27, wherein said first and second cells of said pair are in separate columns of cells.

31. The method of claim 27, wherein said diffusion of each said first cells underlaps said floating gate of each of said first cells.

32. The method of claim 27, wherein said magnitudes are adjusted by applying a first said reference potential to said control gate of each of said first cells and by applying a second said reference potential to said control gate of each of said second cells.

33. The method of claim 27, wherein said first and second erasing pulses are generated by circuits including inputs for decoding each cell of each said pair.

34. The method of claim 27, wherein said first and second erasing pulses are generated by circuits including inverters for applying said first and second erasing pulses.

* * * * *